(12) United States Patent
O'Brien et al.

(10) Patent No.: US 6,560,255 B1
(45) Date of Patent: May 6, 2003

(54) METHOD AND APPARATUS FOR CHARACTERIZING LASER MODULES

(75) Inventors: Stephen O'Brien, Orefield, PA (US); John W. Stayt, Jr., Schnecksville, PA (US); Scott L. Broutin, Kutztown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/535,417

(22) Filed: Mar. 24, 2000

(51) Int. Cl.[7] .................................. H01S 3/04
(52) U.S. Cl. ......................... 372/34; 356/519
(58) Field of Search .................. 356/519; 372/32, 372/34

(56) References Cited

U.S. PATENT DOCUMENTS

| | | | |
|---|---|---|---|
| 3,987,373 A | * | 10/1976 | Mohler ........................ 372/34 |
| 5,737,077 A | | 4/1998 | Lee |
| 5,812,294 A | | 9/1998 | Wilson |
| 5,949,936 A | | 9/1999 | Chen |
| 5,963,567 A | | 10/1999 | Veselka |

* cited by examiner

Primary Examiner—Samuel A. Turner
Assistant Examiner—Patrick Connolly

(57) ABSTRACT

A laser module characterization apparatus and method, the apparatus controlled by a computer, the apparatus having a laser module, an internal etalon transducer, an external etalon, and an external etalon transducer. The laser module comprising a laser source substantially simultaneously emitting a pair of substantially identical beams of light and an internal etalon adapted to receive a first of the pair of beams of light and to permit a portion of the first beam to pass through the internal etalon. The internal etalon transducer connected to the computer and responsive to the portion of the first beam. The external etalon adapted to receive a second of the pair of beams of light and to permit a portion of the second beam to pass through the external etalon. The external etalon transducer connected to the computer and responsive to the portion of the second beam.

26 Claims, 3 Drawing Sheets

METHOD AND APPARATUS FOR CHARACTERIZING LASER MODULES

FIELD OF THE INVENTION

This invention relates to characterizing a laser module that contains an internal etalon. In particular, the invention relates to using an external etalon as a wavelength reference to characterize a wavelength selectable laser that contains an internal etalon.

DESCRIPTION OF THE RELATED ART

Recently, wavelength selectable lasers have been designed to include an internal etalon that is used as a wavelength reference for laser optical output. It is known in the art to use a Fabry-Perot etalon as the internal etalon. A Fabry-Perot etalon is an etalon in which the end faces of a solid, transparent body are used as the etalon reflecting surfaces. Coatings may be applied to one or both surfaces to enhance performance. A known disadvantage of Fabry-Perot etalons is that changes in temperature cause changes in the thickness and index of refraction of the material making up the solid transparent body of the etalon. Thus, it is known in the art that an internal etalon used as a wavelength reference in wavelength selectable laser products is highly temperature dependent with respect to its periodic output response as a function of wavelength. For this reason, all wavelength selectable products containing etalons must be fully characterized to provide look-up information required to control and lock the wavelength of the product. Typically, this characterization is very time consuming and therefore very costly.

The prior art discloses methods that make use of wavemeters or "scanning type" optical spectrum analyzers to characterize wavelength selectable laser products. These instruments create a look-up table by comparing their measured value to the internal etalon response. The look-up tables define the channels upon which the wavelength of the product will be locked. However, using scanning type wavemeters or optical spectrum analyzers is time consuming, on a per unit basis, and cannot be made practical for use in high volume manufacturing.

For example, using an optical spectrum analyzer to characterize a wavelength selectable laser product can take as long as one second per data point to accumulate the requisite number of data points to adequately characterize the product, which is typically 500 data points. The amount of time it takes to measure one data point becomes significant when a large amount of data points are required to fully characterized a single device.

A need exists in the laser products industry for high speed testing and characterization of wavelength selectable laser products to maximize product throughput and, thus, reduce costs in a manufacturing environment. The present invention addresses this need by providing a method and apparatus for virtually instantaneous characterization of wavelength selectable laser products by using an external etalon as an absolute wavelength reference. A structure of the present invention may also be adapted to decrease the testing time for making time-resolved spectroscopy measurements, such as wavelength chirp, which is a typical measurement required for designing and manufacturing most distributed feedback lasers, distributed Bragg-Reflector lasers, and electroabsorption modulated laser sources.

SUMMARY OF THE INVENTION

The invention relates to laser module characterization apparatus and a method therefor. The apparatus is preferably controlled by a computer and includes a laser module, an internal etalon transducer module, an external etalon, and an external etalon transducer. The laser module has a laser source substantially simultaneously emitting a pair of substantially identical beams of light, and an internal etalon adapted to receive a first of the pair of beams of light and to permit a portion of the first beam to pass through the internal etalon. The internal etalon transducer is connected to the computer and is responsive to the portion of the first beam. The external etalon is adapted to receive a second of the pair of beams of light and to permit a portion of the second beam to pass through the external etalon. The external etalon transducer is connected to the computer and is responsive to the portion of the second beam.

According to a method of the invention, the laser module is characterized by (1) energizing a laser source of the laser module at a first wavelength; (2) substantially concurrently measuring a response of the internal etalon and a response of an external etalon to the first wavelength of the laser source; (3) substantially concurrently storing the internal etalon response and the external etalon response in a memory; (4) comparing the internal etalon response to the external etalon response at the first wavelength; and (5) generating a characteristic of the laser module according to the comparison.

DETAILED DESCRIPTION OF AN EMBODIMENT OF THE INVENTION

While the invention will be described in connection with one or more preferred embodiments, it will understood that the description is not intended to limit the invention to the described embodiments. On the contrary, the description is intended to cover all alternatives, modifications and equivalents as may be included within the spirit and scope of the invention as defined by the appended claims.

Figure 1:
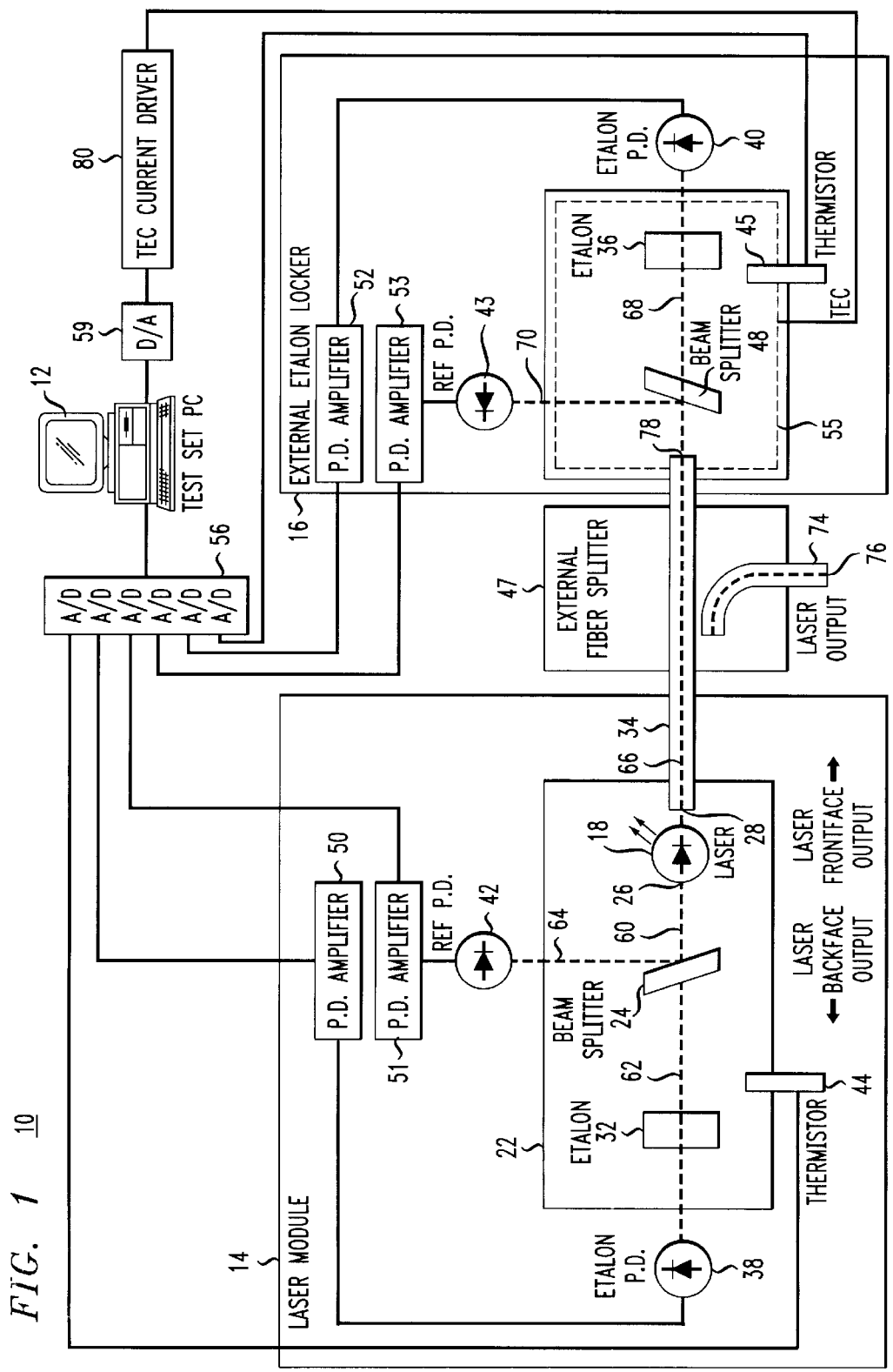
FIG. 1 is a block diagram of the laser module characterization apparatus according to an embodiment of the invention.

Referring now to the drawings, wherein like numerals indicate like elements, there is shown in FIG. 1 a wavelength-selectable laser characterization apparatus 10 in accordance with the present invention. Apparatus 10 includes a computer 12 and comprises laser module 14 and external etalon locker 16. Laser module 14 comprises a laser source 18, an internal etalon 32, and an internal beam splitter 24, all preferably mounted on an optical subassembly 22. Preferably, the laser source 18 is a distributed bragg reflector laser. The internal etalon 32 has a transparent body, preferably made of quartz. The optical sub-assembly 22 is preferably made of silicon. The laser module 14 also includes an internal etalon transducer 38 and an internal reference transducer 42.

The laser source 18 has laser face outputs, such as the laser back face output 26 and the laser front face output 28 shown in FIG. 1. The internal beam splitter 24 is positioned in laser module 14 to communicate light from one of the laser face outputs of the laser source 18, such as the laser backface output 26, to the internal etalon 32 and the internal reference transducer 42. The internal etalon transducer 38 is positioned to receive light from the internal etalon 32 and is electrically connected to computer 12 via internal etalon amplifier 50 and an analog-to-digital converter, preferably in an analog-to-digital converter bank 56. The internal reference transducer 42 is similarly connected to computer 12 via internal reference amplifier 51 and an analog-to-digital converter.

As shown in FIG. 1, the external etalon locker 16 is removably connected to laser module 14 via a laser beam conduit 34. The external etalon locker 16 comprises an external etalon 36, a second external beam splitter 48, an external etalon transducer 40 and an external reference transducer 43. The second external beam splitter 48 is positioned in the locker 16 to communicate light from one of the laser face outputs of the laser source 18, such as the laser frontface output 28, to the external etalon 36 and the external reference transducer 43. A first external beam splitter 47 provides laser light output 76 through a second laser beam conduit 74. The external etalon transducer 40 is positioned to receive light from the external etalon 36 and is electrically connected to computer 12 via external etalon amplifier 52 and an analog-to-digital converter, which is preferably housed within the analog-to-digital converter bank 56. The external reference transducer 43 is similarly connected to the computer 12 via external reference amplifier 53 and an analog-to-digital converter. Preferably, both the internal etalon transducer and the external etalon transducer are capable of detecting frequencies in a range of about 10 to about 20 MHz in a low noise configuration.

In the preferred embodiment, the external etalon locker 16 is environmentally stabilized, that is, the temperature of the external etalon locker 16 is held substantially constant. In the embodiment shown in FIG. 1, the external etalon locker 16 is environmentally stabilized by a temperature control device 55, such as a thermal electric cooler (TEC). The temperature control device 55 is connected to the computer 12 via a current driver 80 and a digital-to-analog converter 59. A temperature transducer 45, preferably a thermistor, responsive to the temperature of the external etalon locker 16, is electrically connected to computer 12 via an analog-to-digital converter. The analog-to-digital converter is preferably located in the analog-to-digital bank 56.

Any one or all of the internal etalon transducer 38, the external etalon transducer 40, the internal reference transducer 42, and the external reference transducer 43 may be any one of a power detector, an optical-to-electric converter or a photodiode.

Figure 2:
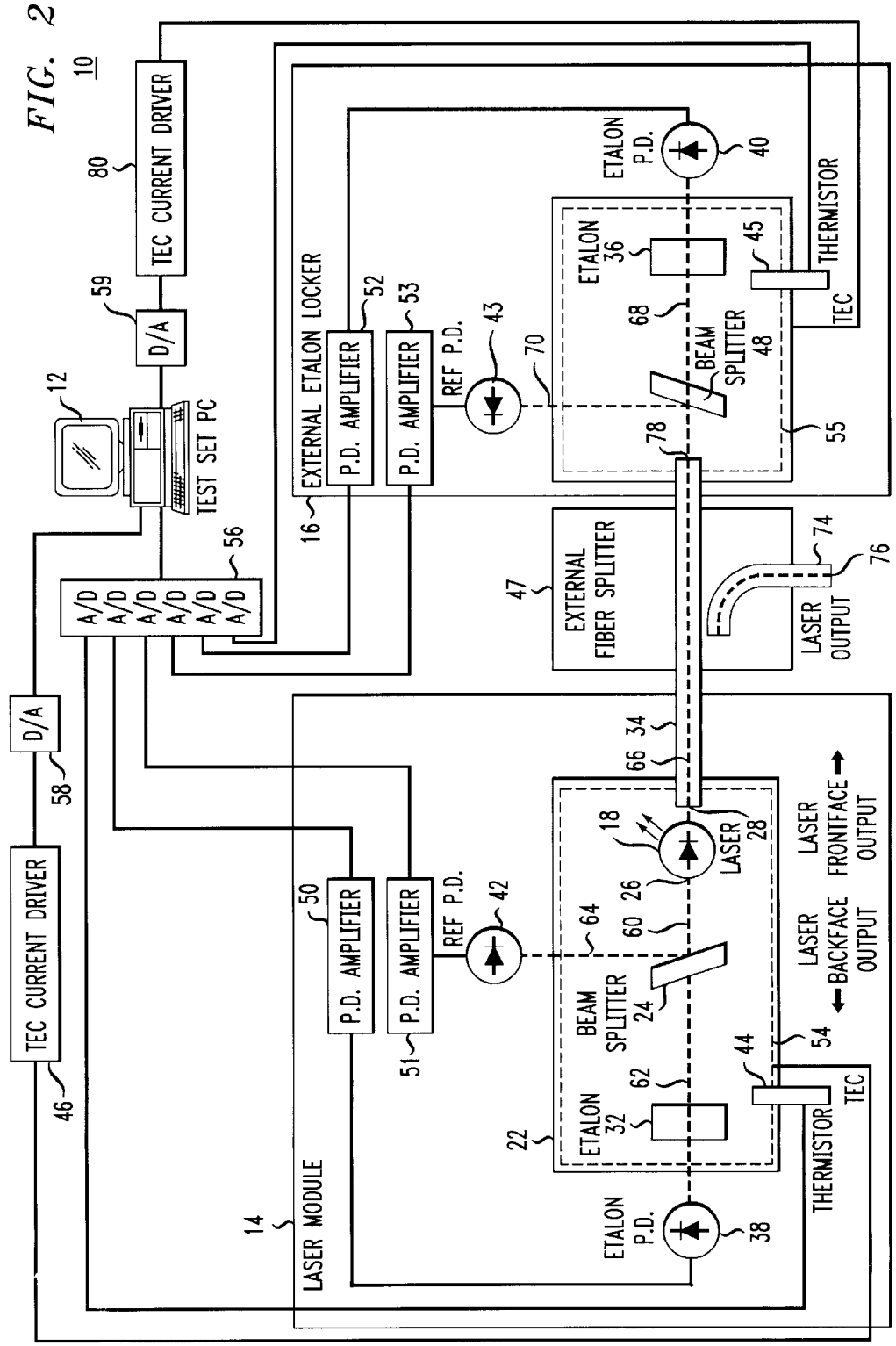
FIG. 2 is a block diagram of the laser module characterization apparatus according to a preferred embodiment of the invention.

Referring to FIG. 2, there is shown another embodiment of the invention wherein a temperature control device 54, such as a thermal electric cooler (TEC),is added to the embodiment shown in FIG. 1 to control the temperature of the laser source 18. The temperature control device 54 is preferably located in contact with the optical subassembly 22. The temperature control device 54 is connected to the computer 12 via a current driver 46 and a digital-to-analog converter 58. A temperature transducer 44, preferably a thermistor, responsive to the temperature of optical subassembly 22, is electrically connected to computer 12 via an analog-to-digital converter. The analog-to-digital converter is preferably located in the analog-to-digital bank 56.

Computer 12 controls the laser wavelength by controlling the temperature of the optical subassembly 22. The computer 12 sends control commands to current driver 46 according to temperature readings received via temperature transducer 44 and a combination of internal etalon transducer 38 and internal reference transducer 42 readings. The current driver 46, responsive to the control commands, supplies current to the temperature control device, thereby controlling the temperature of the optical subassembly 22.

Referring again to FIG. 1, apparatus 10 performs a method of the invention by using an external etalon 36, having predetermined characteristics as a function of wavelength, to perform absolute wavelength characterization measurements on wavelength selectable lasers having an internal etalon 32. As described above, one method of providing an external etalon having predetermined characteristics as a function of wavelength is to environmentally stabilize the external etalon.

In operation, the laser source 18 is energized and radiates a pair of substantially identical beams of light at a predetermined first wavelength in at least two directions away from the source 18, and through face outputs of the source 18, such as frontface output 28 and backface output 26. An exemplary pair of beams are depicted in FIG. 1 as a first beam 60 and a second beam 66. The internal etalon 32 is positioned to receive the first of the beams, and external etalon 36 is positioned to receive the second of the beams.

In the embodiment of the invention depicted in FIG. 1, an internal beam splitter 24 is positioned between the laser source 18 and internal etalon 32, and a first external beam splitter 47 and a second external beam splitter 48 are positioned between the laser source 18 and external etalon 36. The internal beam splitter 24 splits the first beam 60 into an internal etalon beam 62 and a first reference beam 64. Internal etalon transducer 38 measures the response of internal etalon 32 to the internal etalon beam 62 and transmits a signal representing the response, via internal etalon amplifier 50, to computer 12 where the response is stored in a memory (not shown). The internal reference transducer 42 is positioned to receive the first reference beam 64 via internal reference amplifier 51 and transmits a signal representing the first reference beam 64, via internal reference amplifier 51, to the computer 12. The first external beam splitter 47 splits the second beam 66 into laser light output beam 76 and external etalon input beam 78. The second beam 66 is preferably split such that 90% of the second beam 66 becomes laser light output beam 76, and 10% becomes external etalon input beam 78.

The second external beam splitter 48 splits the external etalon input beam 78 into an etalon beam 68, a second reference beam 70. The external etalon transducer 40 measures the response of external etalon 36 to the external etalon beam 68 and transmits a signal representing the response, via an external etalon amplifier 52, to computer 12 where the response is stored in the memory. The external etalon response is directly related to external etalon beam wavelength and amplitude. The external reference transducer 43 is positioned to receive the second reference beam 70 and transmits a signal representing the second reference beam 70 to the computer 12. The computer 12 processes the internal etalon response signal, the first and the second reference beam signals, and the external etalon response signal and generates a characteristic of the internal etalon 32.

In another embodiment, the laser source 18 emits a plurality of laser wavelengths. The plurality of wavelengths may be generated by any known means in the art, preferably by varying a laser temperature from a first temperature to a second temperature. The plurality of wavelengths may also be generated by a continuous wavelength sweep or a discretely stepped wavelength change. It is well known that the output wavelength of a laser source will vary in response to variations in the temperature of the laser source 18. Thus, one embodiment of the invention contemplates using the temperature control device 54 to vary the temperature of the laser source, thereby generating a plurality of laser wavelengths. In another embodiment, the temperature of the laser source 18 is varied by a tunable laser, such as, for example, a distributed Bragg-Reflector (DBR) laser. In yet another embodiment, wherein the laser source 18 is mounted on an optical subassembly 22, varying the temperature of the optical subassembly 22 will also generate a plurality of laser wavelengths. In a preferred embodiment, the plurality of laser wavelengths change from a start test wavelength to an end test wavelength at predetermined intervals and at a predetermined rate.

Figure 3:
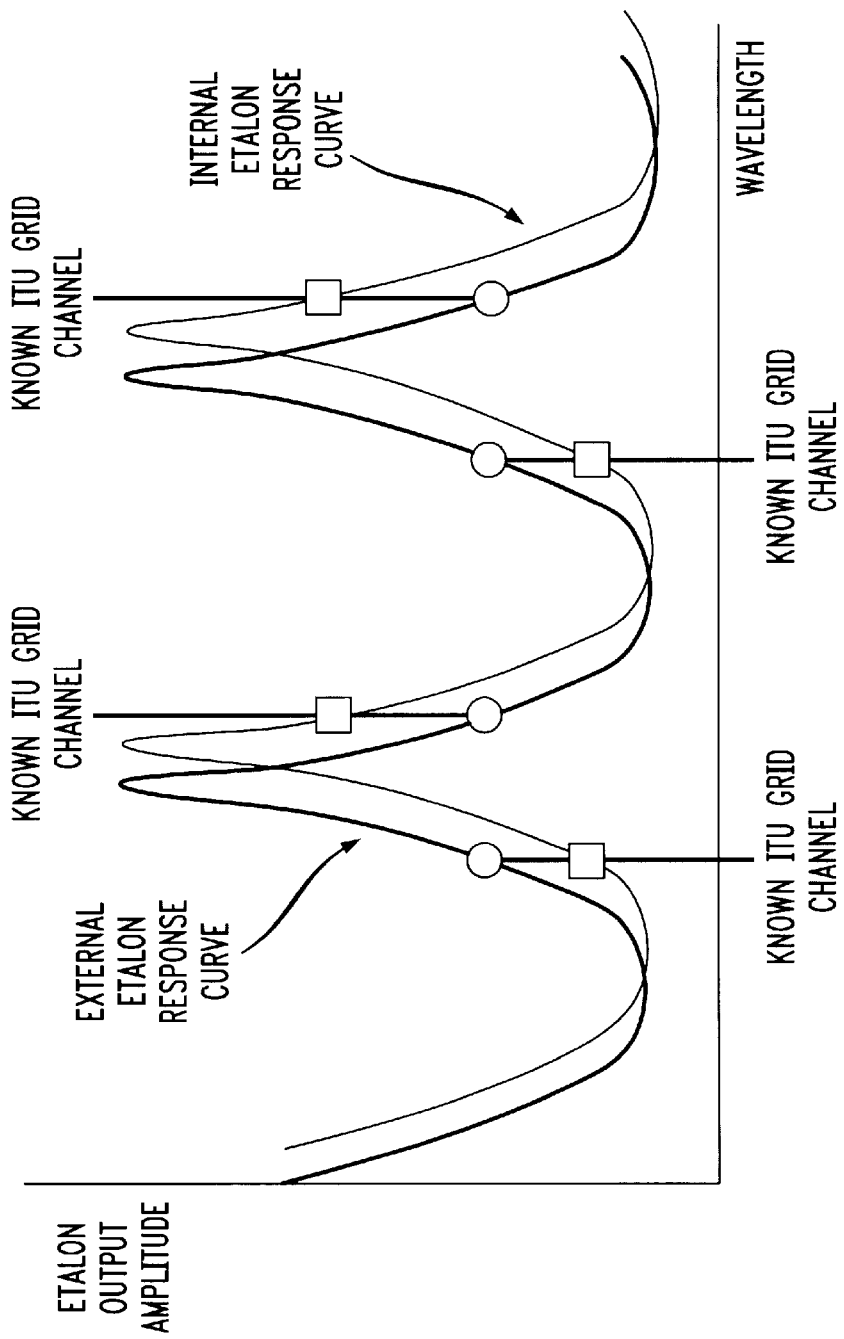
FIG. 3 is a graph depicting the relationship between external etalon output amplitude and internal etalon output amplitude across a plurality of laser wavelengths according to an embodiment of the invention.

Referring to FIG. 3, there is shown a graph depicting the relationship between external etalon output amplitude and internal etalon output amplitude across a plurality of laser wavelengths according to the invention. The curve marked "External Etalon Response curve" is a plot of the response of the external etalon 36 to a series of increasing laser wavelengths. Each marked point on the external etalon response curve represents an external etalon output value at an absolute wavelength reference of the laser source 18. In a preferred embodiment, the output values of external etalon 36 are known at exact International Telecommunication Union (ITU) grid channels when the external etalon 36 is held at a constant temperature. In this embodiment, the ITU grid channels are at least one operating wavelength of the wavelength selectable laser. Maintaining the external etalon 36 at a constant temperature stabilizes the index of refraction and the physical dimensions of the material comprising the etalon. It is known in the art that by knowing the index of refraction and thickness of an etalon, its response characteristics can be predetermined. Thus, the external etalon 36 contemplated in an embodiment of the invention is well-defined with respect to the output values it produces at a plurality of wavelengths, including at exact ITU grid channels.

The curve marked "Internal Etalon Response curve" is a plot of the response of the internal etalon 32 of the invention corresponding to the same series of laser wavelengths as the external etalon 36. In one embodiment, as the temperature of the laser source 18 varies to change the wavelength of laser source 18, the temperature sensitivity of the internal etalon 32 causes the internal etalon response to shift in reference to the external etalon response. Thus, each point on the internal etalon response curve represents an internal etalon output value that can be directly correlated to the output value of the external etalon 36 at an absolute wavelength reference.

FIG. 3 shows vertical lines on the graph, each line intersecting both the external and internal etalon response curves at a known ITU grid channel. The points of intersection of each line represent an external etalon output value and corresponding internal etalon output value at the wavelength of a known ITU grid channel. A circle and a square on each vertical line represent the intersection points on the external etalon response curve and the internal etalon response curve, respectively.

An internal etalon characteristic value, which is unknown, that is based on the comparison between the external etalon response curve, which is known, and the internal etalon response curve at at least one wavelength, is stored in a look-up table. The characteristic may represent an internal etalon crossing point, which is the value of the internal etalon response at a laser wavelength. Preferably, the laser wavelength is a known ITU grid channel. A plurality of internal etalon characteristic values for each laser module 14 may be measured for a plurality of crossing points and stored in the look-up table. In an embodiment of the invention, the look-up table is stored in an electrically erasable programmable read-only memory (EEPROM) within the laser module 14.

What is claimed is:

1. A method for characterizing a laser module having an internal etalon, the method comprising the steps of:

energizing a laser source of said laser module at a first wavelength;

substantially concurrently measuring a response of said internal etalon and a response of an external etalon to the first wavelength of the laser source;

substantially concurrently storing the internal etalon response and the external etalon response in a memory;

comparing the internal etalon response to the external etalon response at the first wavelength; and generating a characteristic of said laser module according to the comparison.

2. The method of claim 1 wherein the first wavelength is an ITU grid channel wavelength.

3. The method of claim 1 wherein the first wavelength is user-definable.

4. The method of claim 1 wherein the characteristic represents the difference between the internal etalon response and the external etalon response at the first wavelength.

5. The method of claim 1 further comprising the step of storing the characteristic in a look-up table in the memory.

6. A method for characterizing a laser module having an internal etalon, the method comprising the steps of:

generating a plurality of laser wavelengths from a laser source;

substantially continuously monitoring a response of said internal etalon to each of the plurality of laser wavelengths;

substantially continuously monitoring a response of an external etalon to each of the plurality of laser wavelengths;

comparing the internal etalon response to the external etalon response at at least one of the plurality of laser wavelengths; and generating at least one characteristic of said laser module according to the comparison.

7. The method of either of claims 1 or 6 wherein the external etalon is environmentally stable.

8. The method of claim 6 wherein the plurality of laser wavelengths are generated in a continuous wavelength sweep.

9. The method of claim 6 wherein the plurality of laser wavelengths are generated in a discretely stepped wavelength change.

10. The method of claim 6 wherein the plurality of laser wavelengths are generated by varying a laser temperature from a first temperature to a second temperature.

11. The method of claim 6 wherein the plurality of laser wavelengths are generated by a tunable laser.

12. The method of claim 11 wherein the tunable laser is a distributed Bragg-Reflector (DBR) laser.

13. The method of claim 6 wherein the laser source generates the plurality of laser wavelengths from a start test wavelength to an end test wavelength at predetermined intervals and at a predetermined rate.

14. The method of claim 6 wherein at least one of the plurality of laser wavelengths is an ITU grid channel wavelength, and further comprising the step of:
   creating a look-up table comprising a plurality of internal etalon response crossing points.

15. A laser module characterization apparatus, the apparatus controlled by a computer, the apparatus comprising:
   a laser module comprising
      a laser source substantially simultaneously emitting a pair of substantially identical beams of light;
      an internal etalon adapted to receive a first of the pair of beams of light and to permit a portion of the first beam to pass through the internal etalon;
   an internal etalon transducer responsive to the portion of the first beam, the internal etalon transducer connected to said computer;
   an external etalon adapted to receive a second of the pair of beams of light and to permit a portion of the second beam to pass through the external etalon; and
   an external etalon transducer responsive to the portion of the second beam, the external etalon transducer connected to the computer.

16. The apparatus of claim 15 wherein the laser source has a first-face output and a second-face output, the first beam transmitted through the first-face output and the second laser beam transmitted through the second-face output.

17. The apparatus of claim 16 wherein the first-face output of the laser is a front-face output, and wherein the second-face output of the laser is a back-face output.

18. The apparatus of claim 15 wherein the external etalon is environmentally stabilized.

19. The apparatus of claim 15 wherein the internal etalon transducer and the external etalon transducer are optical-to-electric converters.

20. The apparatus of claim 19 wherein the optical-to-electric converters are photodiodes.

21. The apparatus of claim 15 wherein the internal etalon transducer and the external etalon transducer are capable of detecting frequencies in a range of about 10 to about 20 MHz.

22. The apparatus of claim 15 wherein the laser source is a distributed Bragg-Reflector laser.

23. The apparatus of claim 15 wherein the laser source is a distributed feedback laser.

24. The apparatus of claim 15 further comprising
   a temperature transducer responsive to a laser module temperature, the transducer connected to said computer;
   a temperature control device in the laser module;
   a current source responsive to computer commands, for controlling the laser module temperature, the current source connected between the temperature control device and said computer.

25. The apparatus of claim 24 wherein the temperature control device is a thermo-electric cooler.

26. The apparatus of claim 24 wherein the temperature transducer is a thermistor.

* * * * *